(12) United States Patent
Carito

(10) Patent No.: US 7,344,267 B2
(45) Date of Patent: Mar. 18, 2008

(54) ILLUMINATED TOY BALLOON

(75) Inventor: Domenic Carito, Wakefield, MA (US)

(73) Assignee: Michael Schrimmer, Vernon Hills, IL (US)

( * ) Notice: Subject to any disclaimer, the term of this patent is extended or adjusted under 35 U.S.C. 154(b) by 0 days.

(21) Appl. No.: 10/904,486

(22) Filed: Nov. 12, 2004

(65) Prior Publication Data

US 2006/0104070 A1    May 18, 2006

(51) Int. Cl.
*F21L 4/00* (2006.01)
(52) U.S. Cl. .................. 362/189; 362/194; 362/196; 362/205; 362/806; 446/219; 446/222
(58) Field of Classification Search ............ 200/61.22, 200/61.25, 61.26; 362/189, 184, 194, 195, 362/196, 205, 206, 800, 398, 806; 446/220, 446/222, 224, 219
See application file for complete search history.

(56) References Cited

U.S. PATENT DOCUMENTS

| | | | | |
|---|---|---|---|---|
| 4,586,456 A | * | 5/1986 | Forward | 116/210 |
| 5,025,244 A | * | 6/1991 | Huang | 340/442 |
| 5,215,492 A | | 6/1993 | Kubiatowicz | 446/219 |
| 5,708,874 A | * | 1/1998 | Schrock et al. | 396/174 |
| 5,879,219 A | * | 3/1999 | Penjuke | 446/222 |
| 6,012,826 A | * | 1/2000 | Chabert | 362/363 |
| 6,371,638 B1 | * | 4/2002 | Zingale et al. | 362/565 |
| 6,390,651 B2 | | 5/2002 | Bertrand | 362/352 |
| 6,641,283 B1 | * | 11/2003 | Bohler | 362/238 |
| 2002/0145863 A1 | * | 10/2002 | Stultz | 362/96 |
| 2004/0037071 A1 | * | 2/2004 | Lee | 362/190 |

* cited by examiner

*Primary Examiner*—Sharon E. Payne
(74) *Attorney, Agent, or Firm*—Mark P. White

(57) ABSTRACT

An apparatus for illuminating the interior of a balloon includes a cylindrical plug with an integrally-formed radially extending integral flange insertable within the balloon neck. A light element is affixed to the plug and disposed within the neck. A battery is electrically connected to the light element and is typically mounted next to the light element, or includes the light element in a single assembly. Switching is provided to turn the lighting element on and off which, in the preferred embodiment is effected by inflating the balloon with the apparatus inserted into the balloon neck. The light element may be affixed to the head of the apparatus by magnetic means, by means of a screw-on cap, or by other well-known techniques.

15 Claims, 7 Drawing Sheets

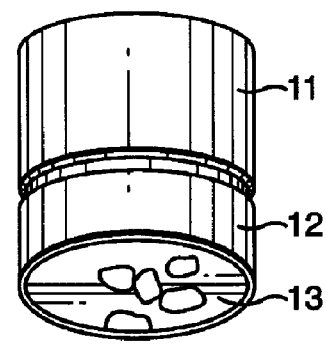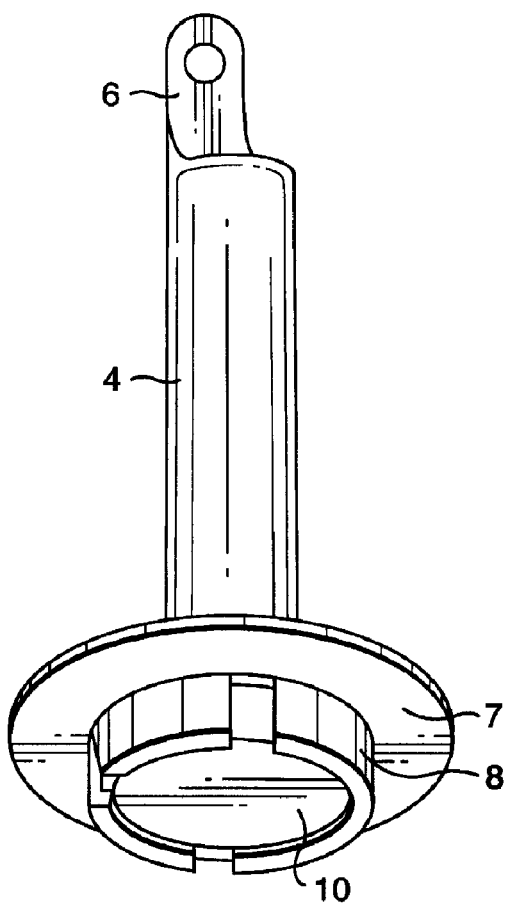
FIG. 2A  FIG. 2B
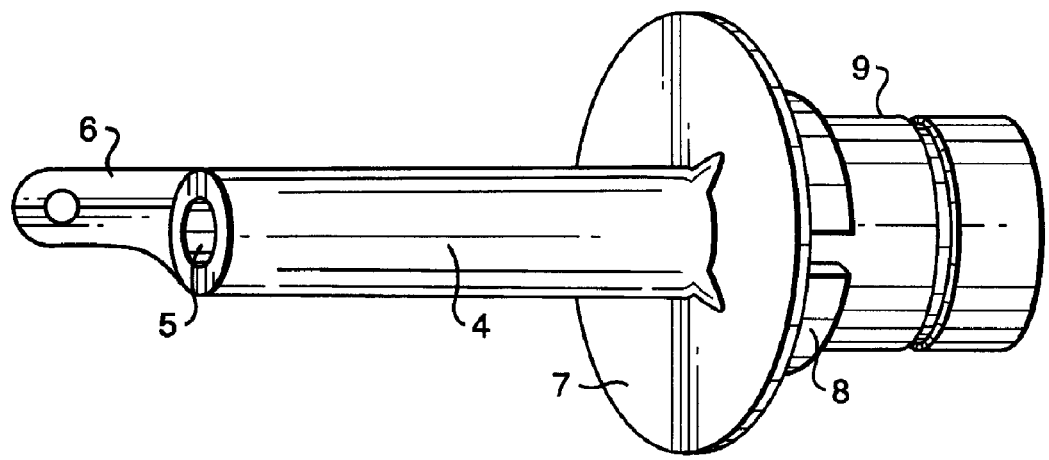
FIG. 3

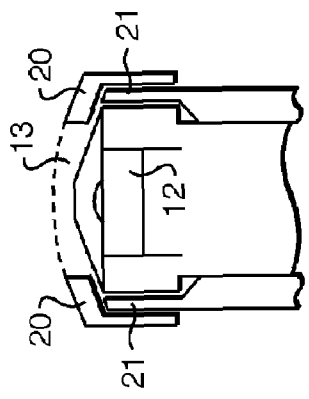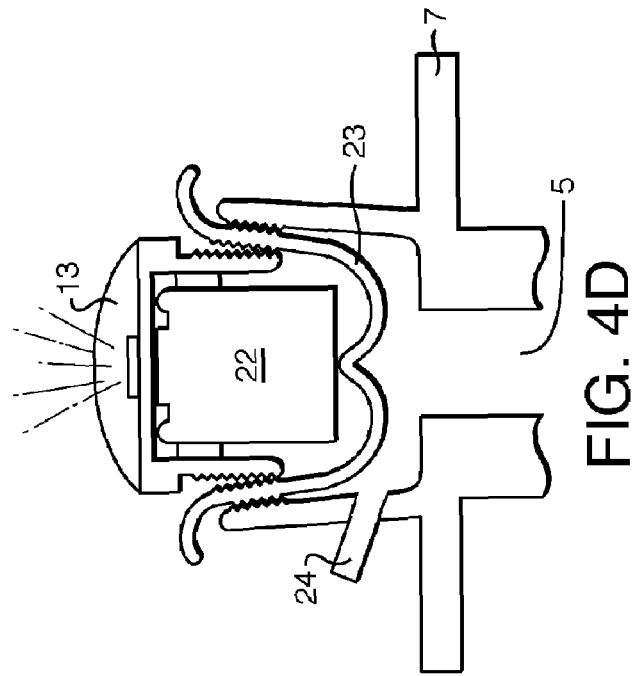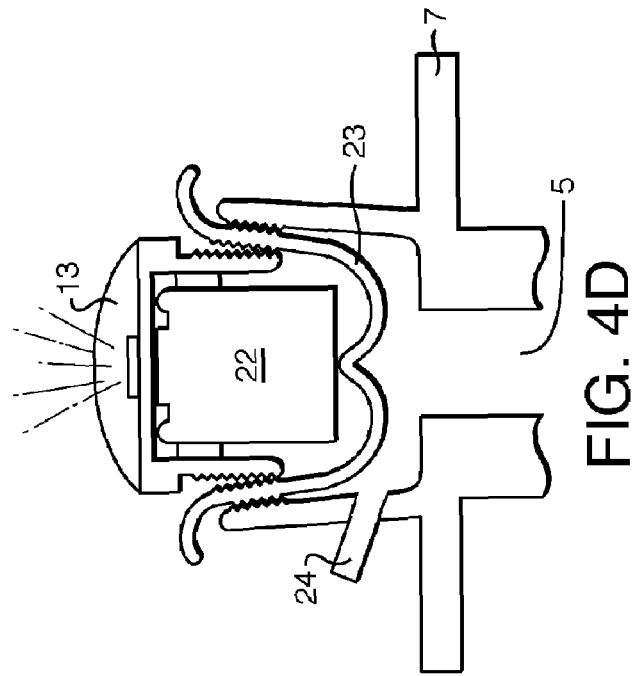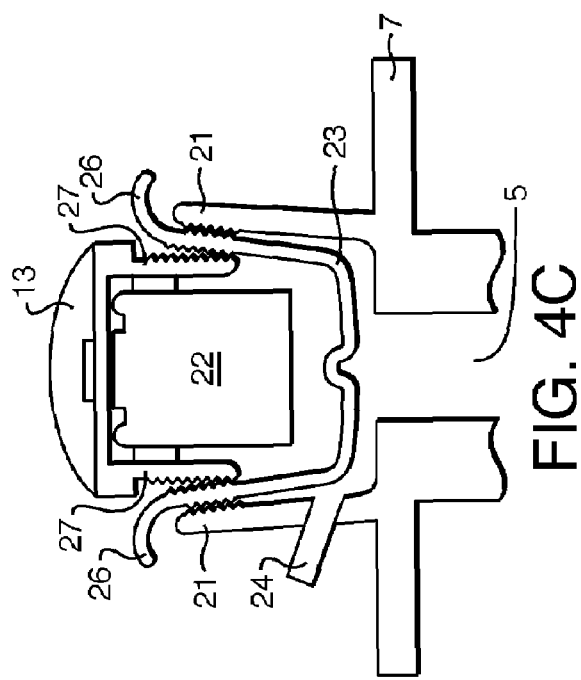

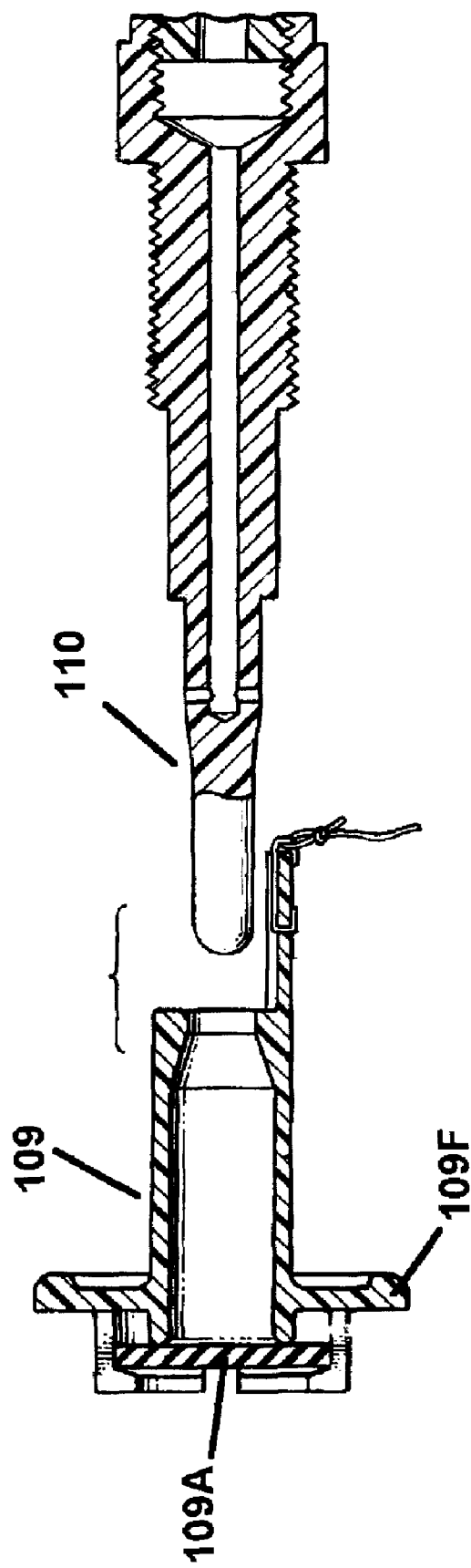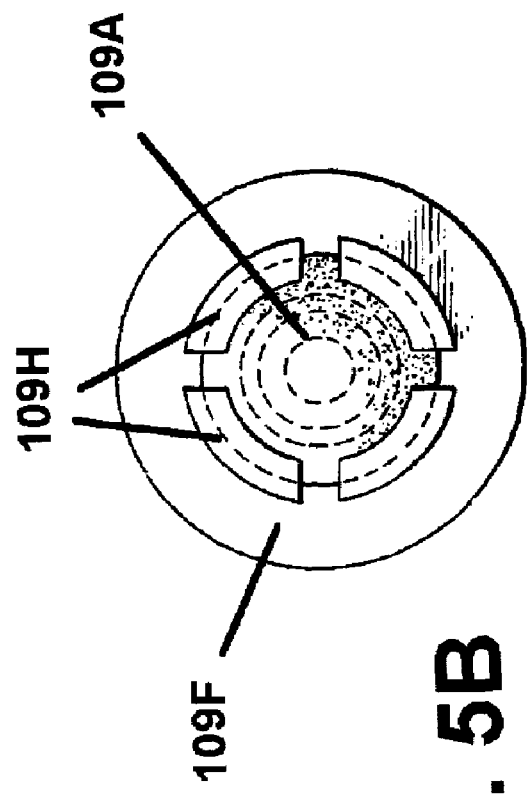
Fig. 5A
Prior Art
Fig. 5B
Prior Art

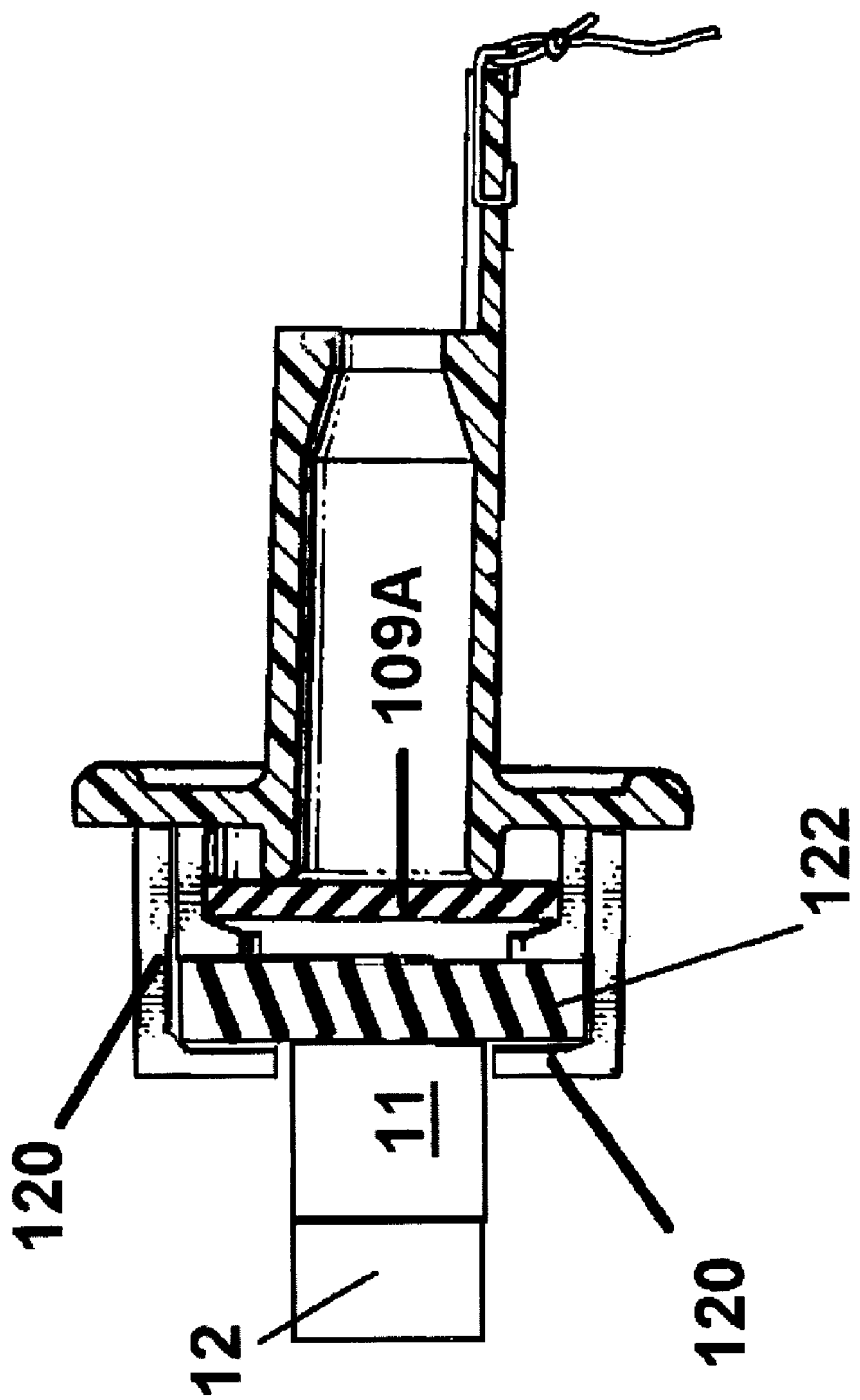

ILLUMINATED TOY BALLOON

FIELD OF THE INVENTION

The present invention relates to illuminated toy balloons. It further relates to devices which may be inserted into toy balloons which cause them to be illuminated.

DESCRIPTION OF THE PRIOR ART

The present invention relates to toy balloons and means for providing light within such balloons either before or after the balloons are inflated, and with the ability to switch the light on or off.

BACKGROUND ART

The use of lights in association with balloons is well known. Examples include U.S. Pat. Nos. 6,390,651 and 5,215,492. Also well known is the use of chemiluminescent materials or light sticks that produce light by chemical reaction which may be inserted into balloons.

The present invention is an improvement over the prior art in which an inexpensive, self-powered apparatus is inserted into the neck of a balloon, which contains a small, energy-efficient light source powered by a battery, and which has the ability to switch on and off.

The present invention further includes embodiments in which the apparatus can be inserted in the balloon, and the balloon then filled with a gas such as helium. The apparatus can then be switched on or off as desired.

SUMMARY OF THE INVENTION

It is an object of the present invention to provide an apparatus which will illuminate the interior of a toy balloon. It is a further object of this invention that the apparatus be disposable.

In accordance with a first aspect of the invention an apparatus is used for illuminating the interior of a balloon which has a neck portion. The apparatus contains a plug insertable in part within the neck portion, which carries a light element attached to the plug. In use the plug is inserted into the balloon neck until the light element is secured within the neck portion.

In accordance with a second aspect of the invention the apparatus includes a battery electrically connected to the light element.

In accordance with a third aspect of the invention the battery is mounted adjacent to the light element.

In accordance with a fourth aspect of the invention switching means are used to turn the lighting element on and off.

In accordance with a fifth aspect of the invention the plug has a body; and a radially extending integral flange formed at the upper end of the body. In use, the plug is inserted into the body until the flange forms a seal at the lower end of the balloon neck, so as to prevent leakage of gas from the balloon.

In accordance with a sixth aspect of the invention a magnetic is used to affix the light element to the plug.

In accordance with a sixth aspect of the invention two or more barbs are disposed so as to affix the light element near or on the plug.

In accordance with a seventh aspect of the invention a screw-on cap is used to affix the light element near to or on the plug.

In accordance with an eighth aspect of the invention the switching means are activated into the on state by the pressure of the gas within the balloon.

In accordance with a ninth aspect of the invention helium gas is used to fill the balloon.

In accordance with a tenth aspect of the invention a light assembly is included which has a threaded upper housing on which the light element is affixed, and a threaded lower housing which mates with the threads of the upper housing. A battery is contained within the two housings and switching is effected by screwing or unscrewing the upper housing relative to the lower housing.

In accordance with a final aspect of the invention the light element is one or more LEDs.

BRIEF DESCRIPTION OF DRAWINGS

This invention itself, both as to its organization and manner of operation, together with further objects and advantages thereof, may be best understood by reference to the following description taken in connection with the accompanying drawings in which:

FIG. 2A depicts a light element assembly containing a battery.

FIG. 2B depicts a perspective view of an embodiment of the apparatus using magnetic means to affix the light element to the plug.

FIG. 3 depicts a perspective view of the embodiment of FIG. 2b, in which the light element assembly is magnetically affixed to the magnet.

FIG. 4A depicts an embodiment of the present invention in which the light element is affixed by means of barbs.

FIG. 4B depicts an embodiment of the present invention in which the light element is affixed by means of restraint fingers.

FIG. 4C depicts an embodiment in which the pressure of gas in the balloon switches on and off the lighting element, in the "off" position.

FIG. 4D depicts an embodiment in which the pressure of gas in the balloon switches on and off the lighting element, in the "on" position.

FIG. 5A depicts a prior-art balloon inflation device in cross section elevation view.

FIG. 5B depicts a prior-art balloon inflation device in top plan view.

FIG. 6A depicts a final embodiment of a lighted balloon inflation device in cross section elevation view.

DESCRIPTION OF PREFERRED EMBODIMENTS

Figure 1:
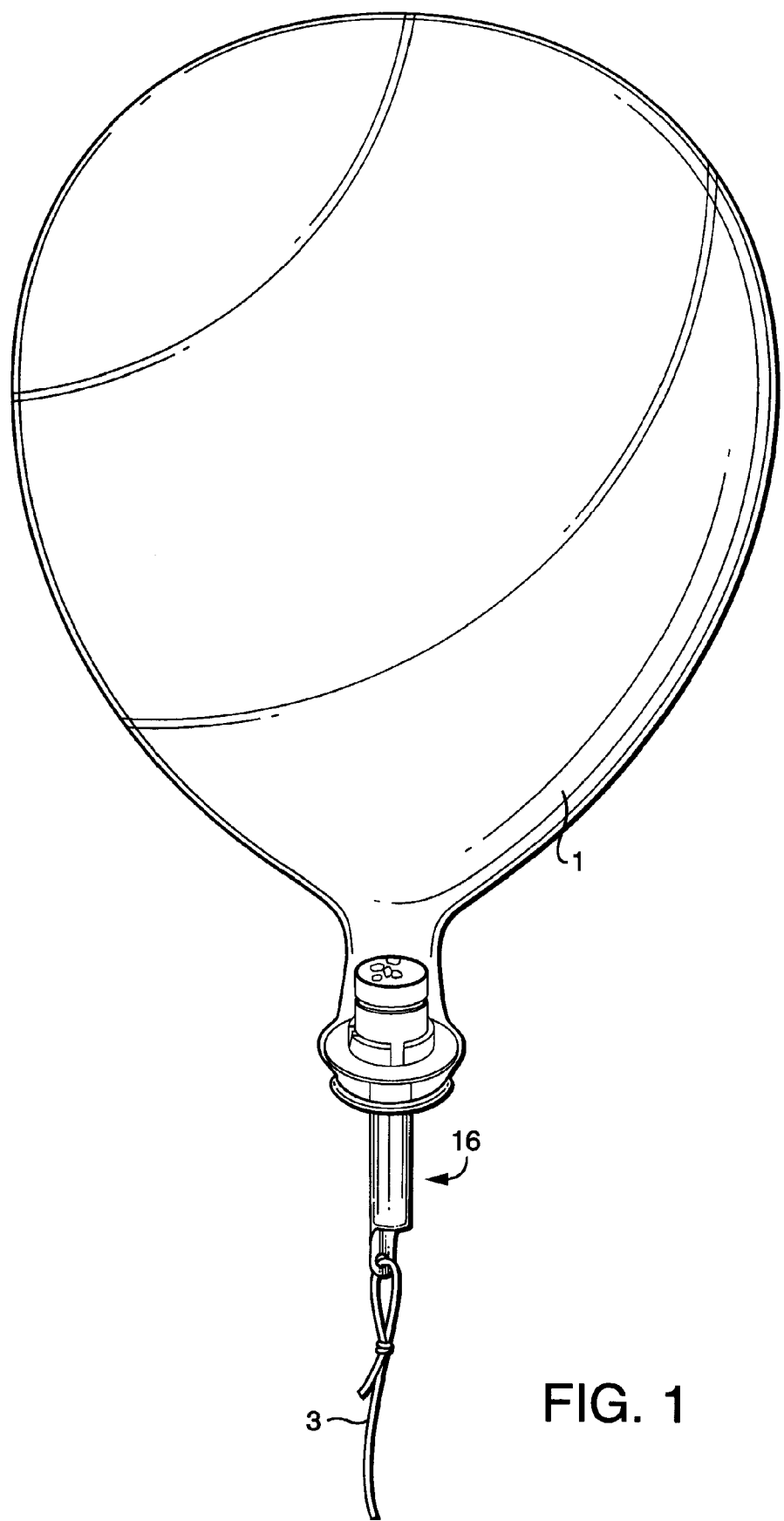
FIG. 1 depicts a perspective view of a balloon containing the apparatus for illuminating the balloon interior.

The present invention may be understood by first referring to FIG. 1. In this figure the device 16 is inserted into the neck of a balloon, with a cord 3 attached to the device restraining the balloon. The balloon is obviously filled with a gas, which may be air, helium, or similarly inert gasses, in the case of balloons used as toys, on account of safety concerns. In other applications, where sufficient safeguards are taken, the gas need not be inert.

Figure 1A:
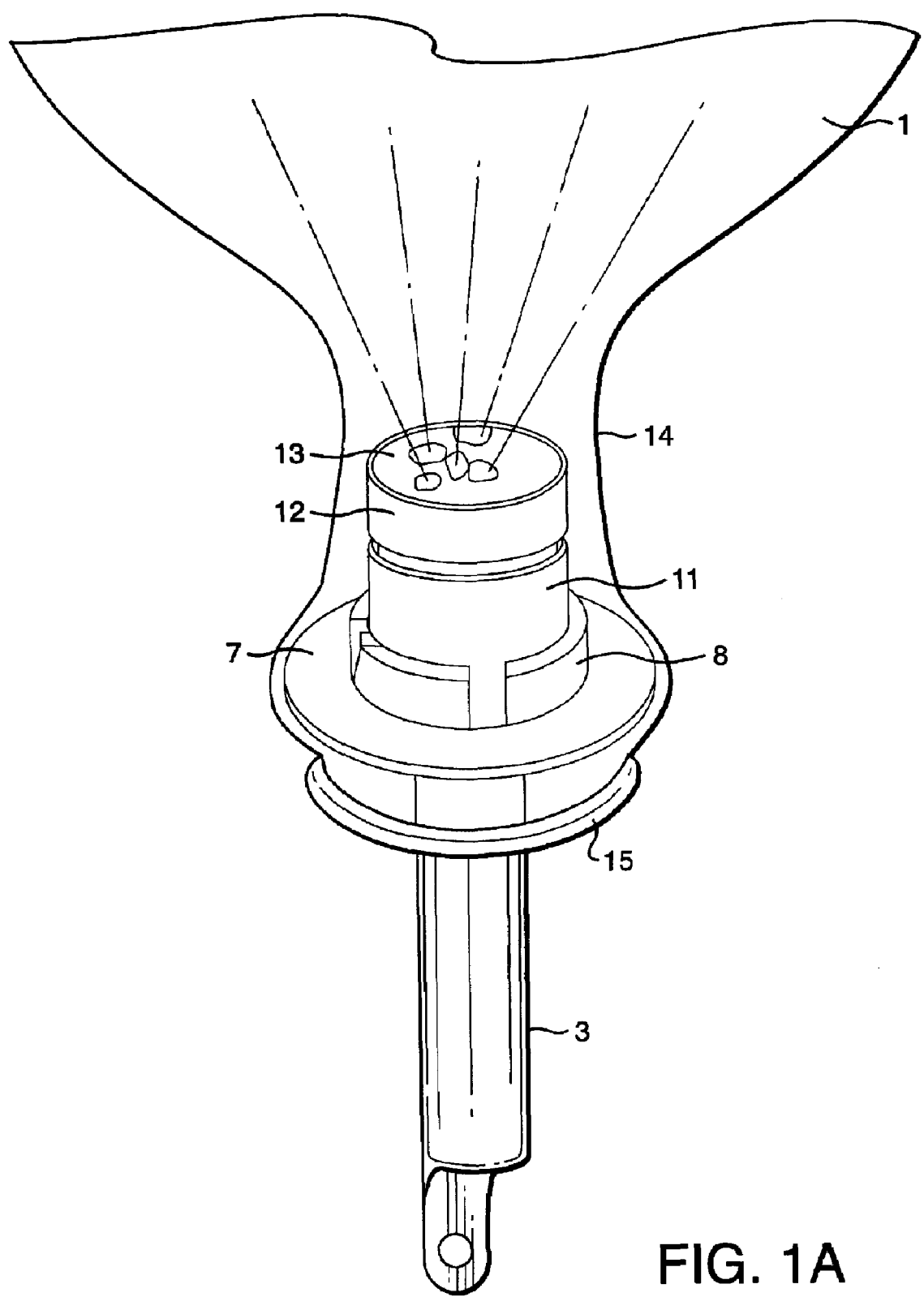
FIG. 1A depicts a detail perspective view derived from FIG. 1, showing the apparatus in greater detail.

Referring now to FIG. 1A, the details of this device are revealed. The device, in the form of a plug, contains a cylindrical body 3 which has an integrally formed radially extending flange 7 which retains the device within the balloon. When the device is inserted into the neck 14 of the balloon, the flange 7 causes the neck to provide a gas-tight seal just above the neck ring 15 at the lower end of the neck, which provides stability for the balloon with the device inserted.

Still referring to FIG. 1A, a light-emitting assembly is shown disposed above the flange 7. The assembly is made up of the light emitting surface 13, which is rigidly affixed to a screw-on cap 12, which attaches to the lower assembly housing 11. A battery which powers the light-emitting assembly is contained within the lower housing and screw-on cap. The user may turn the light on and off by screwing the cap down, and conversely screwing the cap in the opposite direction, relieving pressure and disconnecting power to the light element.

In the embodiment shown in FIG. 1A the light-emitting assembly is restrained in place by guides 8. Also contained in this embodiment is a magnet, not shown in this view, which is disposed below the base of the light-emitting assembly.

The use of the magnet in this embodiment may be further understood by referring next to FIGS. 2A, 2B, and 3. FIGS. 2A and 2B depict the light-emitting assembly separated from the rest of the device. The battery 12, is clearly displayed in this figure, disposed entirely within the guides 8, and concentrically disposed directly upon the flange 7. FIG. 3 shows the two elements combined to form the device prior to insertion into the balloon. Still referring to these figures, the light-emitting assembly is mounted on the flange between the guides 8, and restrained in place by the magnet 10, which attracts the steel body of the light-emitting assembly 9. The body 4 of the device is in the form of a tube, or cylinder, which is hollow, containing a cylindrical chamber 5 and ending in a tab 6, which provides a hole to which a cord may be attached.

In order to use the device, the balloon may first be filled, typically with helium, so that the balloon floats in the air. In one embodiment the balloon is first filled with helium by means well known in the prior art, and which are not a part of this invention. The user pinches off the neck to retain the helium within the balloon, and then quickly inserts the device into the neck of the balloon. Once the insertion has been accomplished, the flange 7 provides a seal so that the helium will not escape from the balloon, except at a very, very slow rate.

In another variation of this invention, the device may contain a one-way valve, or check valve, permitting the helium to be inserted through the cylindrical chamber 5, but not allowing the helium to escape back through the chamber. In this embodiment the valve is located in the body of the device. Ports (not shown) are provided between the valve and the head of the device to allow the helium to enter the balloon, but not escape.

In this embodiment the device is first inserted into the balloon neck, as shown in FIG. 1, before filling. The helium gas is then pumped in through the cylindrical channel 5 of the body 4, which allows the balloon to fill, until the gas is shut off, relieving the pressure in the channel, and causing the check valve to shut off, retaining the pressure within the balloon indefinitely.

The prior art describes and claims a device such a one-way valve in Zeyra, U.S. Pat. No. 4,167,204. Referring now to FIGS. 5A and 5B a basic valve in accordance with said patent is shown. The head 109 of this prior art device contains the radial flange 109F used for the same purpose as in the present patent. The check-valve effect is accomplished by means of the circular resilient disc 109A. The gas is introduced by means of the filler element 110 which is inserted into the head 109, creating pressure which forces the circular resilient disk 109A outward against the guides 109F.

In the present invention a check valve mechanism may be inserted into the body of the apparatus in order to effect the same end. Because such check valves are well known in the art, and because they are not part of the present invention, they will not be further described here.

Figure 6B:
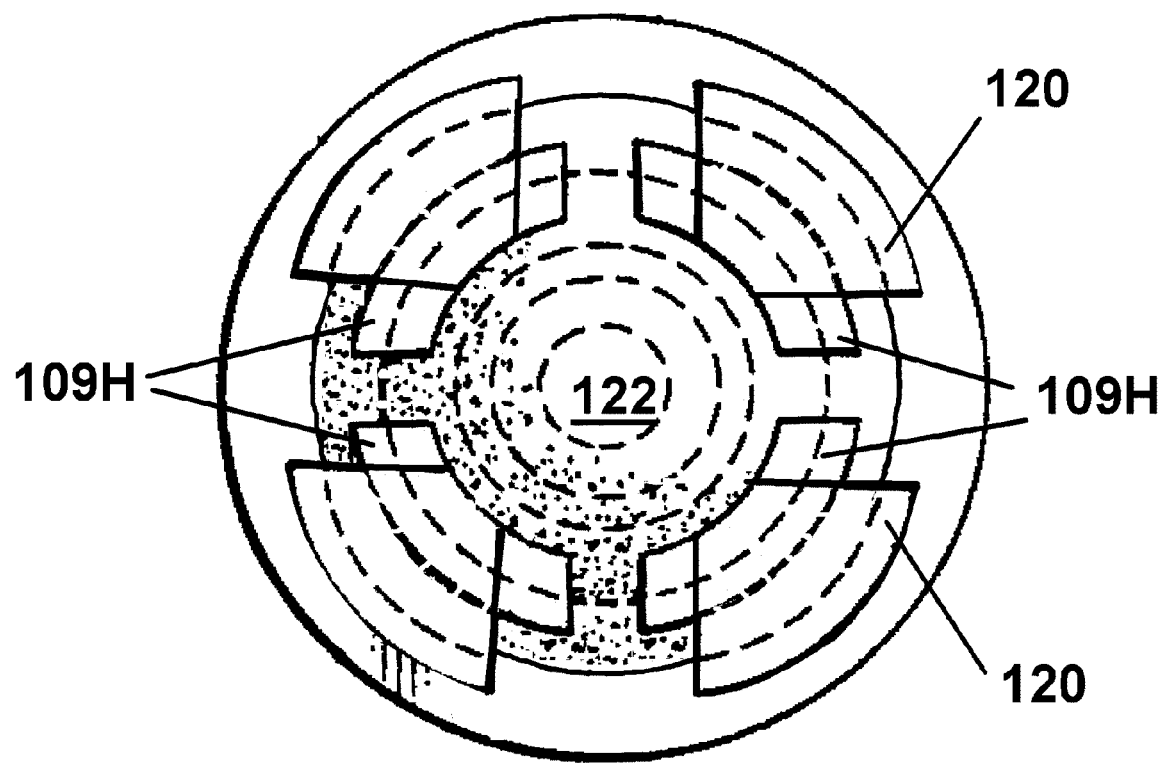
FIG. 6B depicts a final embodiment of a lighted balloon inflation device in top plan view.

A variation of the prior art filler of FIGS. 5A and 5B is shown in FIGS. 6A and 6B. A seen therein, a magnet 122 is mounted atop the lower cage fingers 109H, and is restrained in place by upper cage fingers 120. In this embodiment the magnet does not affect the operation of the check valve in the head, but provides a means for securely retaining the light-emitting assembly.

When using the filler-type device which also illuminates the inside of the balloon, the device is first inserted into the balloon, and then filled with the helium after insertion. Such a variation has the advantage of minimizing the amount of helium lost when the balloon is first filled and then the device is inserted afterwards.

In all of these embodiments the lighting element itself may be of various types. The preferring lighting element is a light-emitting diode (hereinafter "LED") because of the availability of many different types of LEDs, available at very low prices, and further because of the extremely high efficiency and low power drain on the battery caused by the LED. Among the variations commercially available are LEDs which blink, which change color, and combinations of these two effects.

In addition to the magnetic mounting embodiment, many different approaches to mounting of the LED are proposed herein as further embodiments. Referring first to FIG. 4A, the assembly holding the light-emitting element 13 is restrained by barbed fingers 25. The embodiment shown in this figure contains a self-contained light-emitting element having its own battery. It is clear that embodiments in which the battery and LED are separate units may also be used.

In FIG. 4B, a retaining ring 20 is force-fit over a mating enclosure 21 which contains the light-emitting element and battery. In a variation of the embodiment of FIG. 4B a screw-on retaining ring mates with mating threads on the enclosure 21.

Alternative versions are proposed herein for the switching of the light element on and off. In the preferred embodiment depicted in FIG. 1A the user must rotate the upper housing 12 relative to the lower housing 11, as previously stated.

In a final alternative embodiment, the filling of the balloon with helium is used to switch the light element on. Referring first to FIG. 4C, this embodiment contains a battery 22 which is in permanent electrical contact with positive terminal of the LED assembly 13. Ground connection is made by metallic element 23, which is configured to keep the helium from passing into the balloon. Helium enters the balloon only through the port 24. In FIG. 4C helium has not yet been inserted into the balloon: element 23 blocks the helium from entering the balloon except through port 24. As the helium is first introduced contact element 23 blocks port 24. At this stage the helium will force contact element 23 upwards until contact is made with the negative electrode of the battery, thereby completing the electrical circuit and causing the LED to illuminate, as shown in FIG. 4D. The teeth on mating enclosure 21, contact element arms 26, and light-element arms 27 form a ratchet mechanism, so that the contact element will stay in the position of FIG. 4D once the balloon is filled with helium, which is facilitated as the contact element rises to clear port 24, allowing the gas into the balloon through this route.

While the invention has been described with reference to specific embodiments, it will be apparent that improvements and modifications may be made within the purview of the invention without departing from the scope of the invention defined in the appended claims.

What is claimed is:

1. An illuminated inflator for inserting into the neck of a toy balloon, comprising:
   (a) a gastight, cylindrical plug comprising a center and an upper and lower end;
   (b) a hollow filler tube comprising an upper and lower end, the hollow filler tube extending through the center of the plug, with the lower end of the hollow filler tube extending below the lower end of the plug;
   (c) a substantially cylindrical stop valve, affixed to the upper end of the hollow filler tube, and concentric with the plug;
   (b) a substantially cylindrical lower assembly, comprising a battery, affixed in proximity to the upper end of the stop valve and concentric with it;
   c) a substantially cylindrical upper assembly, comprising a light element, affixed to the lower assembly and concentric with it,
   the inflator being sufficiently compact, light weight, and balanced in weight so that when it is inserted into the toy balloon with the cylindrical plug in the neck of the balloon, the bottom of the hollow filler tube extending below the neck of the balloon, and the upper and lower assemblies within the balloon, then when the toy balloon is subsequently filled with gas through the hollow filler tube, the balloon can float freely in the air without support.

2. The illuminated inflator of claim 1, further comprising switching means to turn the light element on and off disposed in proximity to the neck portion.

3. The illuminated inflator of claim 2, further comprising magnetic means to affix the upper assembly to the lower assembly.

4. The illuminated inflator of claim 2, further comprising two or more barbs disposed so as to affix the upper assembly to the lower assembly.

5. The illuminated inflator of claim 2, further comprising a screw-on cap to affix the upper assembly to the lower assembly.

6. The illuminated inflator of claim 2, wherein the switching means further comprise gas pressure means for changing from the "off" state into the "on" state.

7. The illuminated inflator of claim 2 wherein said electronic light element further comprises one or more LEDs.

8. The illuminated inflator of claim 2 wherein said electronic light element further comprises one or more LEDs.

9. An illuminated inflator for inserting into the neck of a toy balloon, comprising:
   (a) a gastight, cylindrical plug comprising an upper and lower end;
   (b) a hollow filler tube comprising an upper and lower end, the hollow filler tube extending through the plug, with the lower end of the hollow filler tube extending below the lower end of the plug;
   (c) a stop valve, affixed to the upper end of the hollow filler tube;
   (b) a lower assembly, comprising a battery, affixed in proximity to the upper end of the stop valve;
   (c) an upper assembly, comprising a light element, affixed to the lower assembly,
   the inflator being sufficiently compact, light weight, and balanced in weight so that when it is inserted into the toy balloon with the cylindrical plug in the neck of the balloon, the bottom of the hollow filler tube accessible at the neck of the balloon, and the upper and lower assemblies within the balloon, then when the toy balloon is subsequently filled with gas through the hollow filler tube, the balloon can float freely in the air without support.

10. The illuminated inflator of claim 9, wherein the hollow filler tube extends through the center of the plug.

11. The illuminated inflator of claim 10, wherein the stop valve, and the upper and lower assemblies are substantially cylindrical in shape.

12. The illuminated inflator of claim 11, wherein the stop valve, and the upper and lower assemblies are concentric with the plug.

13. The illuminated inflator of claim 12, wherein the hollow filler tube extends below the neck of the balloon.

14. A method for filling a toy balloon with gas and illuminating the balloon from within, the method comprising the steps, in order, of:
   (a) assembling an inflator in accordance with claim 9;
   (b) inserting the inflator into the toy balloon, with the plug of the inflator within the neck of the balloon;
   (c) filling the balloon with gas, by blowing the gas through the hollow filler tube;
   (d) removing the inflator from the toy balloon and inserting into another toy balloon; and
   (e) repeating steps b through (d).

15. The method of claim 14, wherein the inflator further comprises switching means for turning the lighting element on and off, the method further comprising turning the lighting element on and off.

* * * * *

UNITED STATES PATENT AND TRADEMARK OFFICE
CERTIFICATE OF CORRECTION

PATENT NO. : 7,344,267 B2  Page 1 of 1
APPLICATION NO. : 10/904486
DATED : March 18, 2008
INVENTOR(S) : Carito It is certified that error appears in the above-identified patent and that said Letters Patent is hereby corrected as shown below:

Claim 1, col. 5, line 22 should read --(d) a substantially cylindrical lower assembly...--
Claim 1, col. 5, line 25 should read --(e) a substantially cylindrical upper assembly...--
Claim 9, col. 6, line 13 should read --(d) a lower assembly, comprising a battery...--
Claim 9, col. 6, line 15 should read --(e) an upper assembly, comprising...--

Signed and Sealed this

Twenty-fourth Day of June, 2008

JON W. DUDAS
*Director of the United States Patent and Trademark Office*